United States Patent [19]
Lo et al.

[11] Patent Number: 5,942,041
[45] Date of Patent: Aug. 24, 1999

[54] NON-STICKING SEMI-CONDUCTOR WAFER CLAMP AND METHOD OF MAKING SAME

[75] Inventors: Yung-Tsun Lo; Tzu-Hsin Huang; Hua-Jen Tseng; Pei-Wei Tsai, all of Hsin chu, Taiwan

[73] Assignee: Mosel-Vitelic, Inc., Hsinchu, Taiwan

[21] Appl. No.: 08/714,217

[22] Filed: Sep. 16, 1996

[51] Int. Cl.⁶ ..................................................... C23C 16/00
[52] U.S. Cl. ......................... 118/728; 118/500; 118/503; 118/504; 204/298.11; 204/298.15; 438/758
[58] Field of Search ..................................... 118/728, 500, 118/503, 504; 204/298.11, 298.15; 438/758

[56] References Cited

U.S. PATENT DOCUMENTS

| | | | |
|---|---|---|---|
| 4,964,594 | 10/1990 | Webb | 244/131 |
| 5,391,275 | 2/1995 | Mintz | 204/192.32 |
| 5,513,594 | 5/1996 | McClanahan | 118/503 |
| 5,556,500 | 9/1996 | Hasegawa et al. | 156/345 |

*Primary Examiner*—Richard Bueker
*Assistant Examiner*—Jeffrie R. Lund
*Attorney, Agent, or Firm*—Tung & Associates

[57] ABSTRACT

A clamp used in clamping semi-conductor wafers during processing operations permits ready release of the wafer and avoids adherence of the clamp to materials deposited onto the wafer which otherwise tend to stick the wafer to the clamp. Adhesion of the deposited materials to the clamp is avoided by providing the clamping surfaces of the clamp with a minimum surface roughness achieved by machining, grinding, etching or other techniques.

12 Claims, 1 Drawing Sheet

NON-STICKING SEMI-CONDUCTOR WAFER CLAMP AND METHOD OF MAKING SAME

TECHNICAL FIELD

The present invention broadly relates to clamping mechanisms for holding a substrate such as a semi-conductor wafer during processing in a vacuum chamber, and deals more particularly with an improved clamp that reduces the tendency of the clamp to adhere to the substrate when the substrate is released for removal from the chamber, as well as to a related method of producing the clamp.

BACKGROUND ART

In the field of semi-conductor processing, various types of processing equipment are now in widespread use which provide for automated handling of wafers in the vacuum chambers where the processing is carried out. Common semi-conductor processes performed in vacuum environments include the deposition of metallic layers on the surface of the wafer, sometimes known as physical vapor deposition (PVD) or sputtering, selective epitaxial deposition, chemical vapor deposition (CVD), plasma etching, ion implantation, etc. These processes typically involve the use of one or more load-lock vacuum chambers in which the wafers are processed, following which they are removed from the chambers.

At a process station within the chamber, is often necessary to hold the wafer firmly against a support surface, typically a heating assembly, in order to maintain the position of the wafer relative to the processing equipment, or to maintain good thermal contact with the heating assembly. A common technique for maintaining the temperature of a wafer undergoing processing in a vacuum environment is to introduce a conductive gas in a narrow space at the back side of the wafer, thereby thermally coupling the wafer to a temperature control element. When using a backside gas, which is introduced at a pressure higher than the ambient pressure within the processing chamber, clamping means are required to ensure that the backside gas does not move the wafer off of the support surface.

In many cases, the particular process used in the process chamber may cause the clamp to adhere to a wafer after completion of a processing step, thus preventing the wafer from being picked up by a robot arm or other transport mechanism. This may occur, for example, when depositing a metal layer over a wafer which causes the wafer to stick to the clamp, or where a top layer of material on the wafer melts or becomes plastic at an elevated temperature used in a processing step, thus causing the top layer to adhere to the clamp. In some cases, repeatedly deposited film, such as a photoresist, accumulates on surfaces of the clamp, thus also tending to cause the wafer to adhere to the clamp.

When a wafer sticks to a clamp, the entire processing system typically must be shut down to free the stuck wafer. This remedial procedure requires the process chamber to be vented and partially disassembled so that the wafer can be manually dislodged from the clamp. This procedure can require several hours of time, and with the additional time required to evacuate and cleanse the chamber, a stuck wafer can result in down time of four to five hours. This naturally reduces wafer throughput of the entire processing system, and results in corresponding revenue losses.

Others in the past have attempted various solutions to the wafer sticking problem described above. For example, one approach involves providing a slightly beveled surface on the clamp so that only the outer most edge of the wafer is contacted, as far as from the deposition process as possible. An overhang or "hood" is formed by the projection of the beveled edge which tends to block sputtered material from reaching the area where the clamp makes physical contact with the wafer. This beveled surface or hood does not, however, completely eliminate the possibility of sticking, because after processing a series of batches, the deposited material tends to accumulate, eventually building up back into the area where the clamp contacts the wafer's edge. Even more serious are those instances where certain films have been deposited onto the entire surface of the wafer and the clamp is applied directly over the deposited film in a subsequent processing step, thus bringing the film and clamping surface into direct contact with each other.

Another attempt at solving the wafer sticking problem is described in U.S. Pat. No. 5,513,594 issued May 7, 1996 to McClanahan. The McClanahan patent discloses the use of a spring-loaded releasing mechanism which applies a biasing force tending to force the wafer away from the clamp upon the release of the clamp. This solution is not entirely satisfactory, however, because of the need to use small springs and mechanisms which add to the complexity for the clamp and potentially reduce reliability. Moreover, spring-loaded release of the wafer from the clamp can result in damage to the wafer or dislodgement of deposited particles that are dispersed into the chamber and can may interfere with subsequent processing steps.

It is therefore a primary object invention to provide a novel semi-conductor wafer clamp which resists adhering to a wafer, thus overcomes the shortcomings of the prior art.

Another object of the present invention is to provide a semi-conductor wafer clamp as described above which provides for ready release of wafers without the need for additional structure or complex mechanisms.

Another object of the present invention is to provide a semi-conductor wafer clamp which is effective in releasing wafers in spite of the fact that deposited films and materials come into mutual contact with both the wafer and the clamp.

A further object of the present invention is to provide a novel method for preventing a wafer clamp from adhering to deposited materials, while also preventing build-up on the clamp of a film formed from the deposited materials.

As a corollary of the foregoing object, another object of the invention is to provide a method of treating at least portions of the surfaces of a semi-conductor wafer clamp which substantially reduces the tendency of the clamp surfaces to stick to the wafer. These, and further objects and advantages of the invention will be made clear or will become apparent during the course of the following description of a preferred embodiment of the present invention.

SUMMARY OF THE INVENTION

In accordance with one aspect of the invention, a novel non-sticking semi-conductor wafer clamp is provided which exhibits markedly improved wafer release characteristics. These improved release characteristics are achieved by treating those surfaces of the clamp which engage or are in proximity to the wafer, so as to achieve a desired surface roughness. Generally, a surface roughness of at least 100 $\mu$m is preferred. The desired surface roughness may be achieved by ordinary machine operations such as surface grinding, or by using etching techniques.

According to another aspect of the invention, a method is provided for preventing a wafer clamp from adhering to a wafer, or materials deposited onto the wafer, which involves treated the surfaces of the clamp to achieve a desired surface roughness.

BRIEF DESCRIPTION OF THE DRAWINGS

In the drawings, which form an integral part of the specification and are to be read in conjunction therewith, and in which like reference numerals are employed to designate identical components in the various views.

DETAILED DESCRIPTION OF THE PREFERRED EMBODIMENTS

Figure 1:
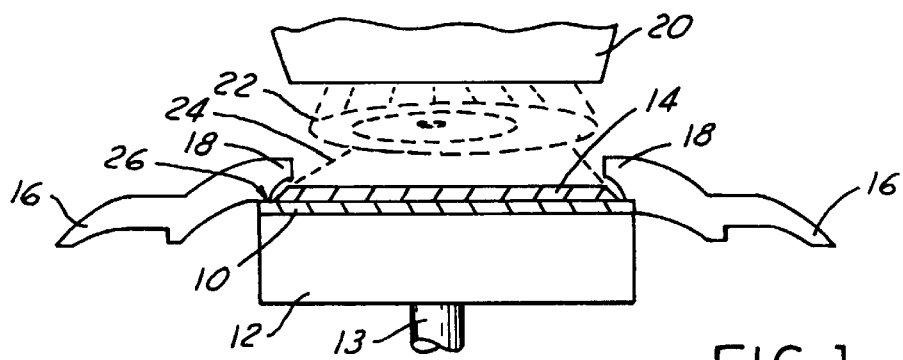
FIG. 1 is a combined diagrammatic and sectional view of a target, a silicon wafer and a clamping ring in accordance with the preferred embodiment.
Figure 2:
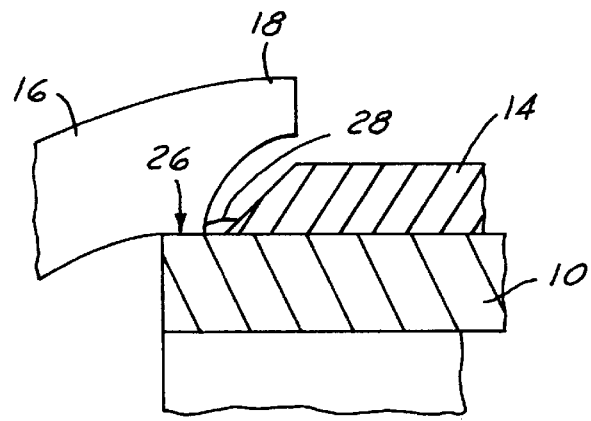
FIG. 2 is an enlarged, fragmentary view of a portion of the clamping ring shown in FIG. 1.

Referring first to FIGS. 1 and 2, the present invention relates to an improved wafer clamp in the form of a clapming ring 16, and method for making the same, which is useful in clamping a semi-conductor wafer 10 onto a support, such as the heating element assembly 12 that is disposed within a vacuum chamber adapted to perform PVD, CVD, ion implantation or other similar processes. A target or sputter source 20 is positioned to face the wafer 10. Other major components of the processing chamber are well-known and need not be described here, although those skilled in the art will appreciate that these components will typically include a stainless steel, vacuum tight chamber equipped with a helium leak detector, a pump having the capacity to reduce the chamber pressure to a desired level, pressure gauges, a power supply and wafer holder, which is depicted in FIGS. 1 and 2 as forming a part of the heating assembly 12. In the case of a PVD process, inert gas particles in the chamber, such as argon, are first ionized in an electrical field producing a gas plasma and are attracted toward the target 20 where the energy of these gas particles physically dislodges atoms of the target material, The shape of the sputtered material distribution 22 depicted in FIG. 1 will depend upon the particular target material, In any event, the particles from the target 20 are deposited onto the wafer 10 and result in the build-up of a film layer 14 of the target material. Layer 14 wilt be generally uniform except for the outer edges which are tapered for reasons discussed below.

The wafer clamping ring 16 serves two purposes in the process chamber. The first purpose is to clamp the wafer 10 to the heating assembly 12. This holds the wafer 10 in place when a positive gas pressure is applied between the heater assembly 12 and a supporting pedestal 13, and thus allows the heat to be effectively conducted between the wafer 10 and heating assembly 12. The second purpose of the clamping ring 16 is to create a predetermined leak rate of the inert gas from beneath the wafer 10 into the process chamber.

The clamping ring 16 is generally ring-shaped, and has a cut-out in its center which is oriented to match the flat contour of the wafer 10. A bevel in the clamping ring is provided near its inner circumference to define a hood 18 which overhangs and covers the outer periphery of the wafer 10, around the latter's entire circumference. The hood 18 effectively shadows the outer periphery of the wafer 10 and tends to protect the outer clamping surface 26 of the clamping ring 16 from being coated by the deposited material.

Without the hood 18, an inordinant amount of material would be deposited near the periphery of the wafer 10, which in turn would tend to weld the wafer 10 to the clamping ring 16. When welding occurs between the clamping ring 16 and the wafer 10, severe contamination by particles occurs when the wafer 10 is broken from the clamping ring 16, thereby leading to lower yields of wafer production.

Notwithstanding the use of the hood 18, some amounts of the deposited material, is shown by the numeral 28 and FIG. 2, may nevertheless occur, which are contiguous to and tend to bond the clamping ring 16 and the wafer 10.

Figure 3:
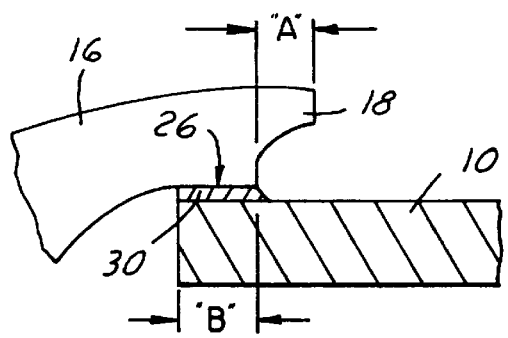
FIG. 3 is a view similar to FIG. 2, but showing a layer of photoresist clamped between the wafer and the clamping ring.
Figure 4:
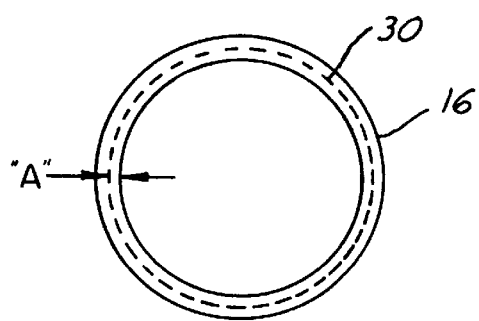
FIG. 4 is a top view of a portion of the clamping ring disposed over the wafer before etching of a photoresist.
Figure 5:
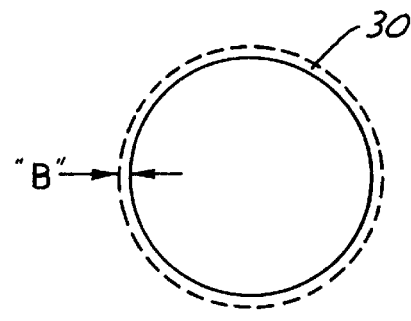
FIG. 5 is a view similar to FIG. 4, but following etching of the photoresist and removal of the clamping ring.

The problem of the wafer sticking to the clamp is even more severe in certain types of processes where substantial amounts of deposited materials contact both the wafer and the clamp. For example, referring now to FIGS. 3–5, in the case of an ion implantation process, a layer of photoresist 30 is applied to the surface of a wafer 10, which is later etched away, leaving a ring-shaped layer 30 of photoresist which is clamped directly between the clamping surface of the clamping ring 16 and the wafer 10. In FIG. 4, it can be seen that the ring-shaped clamp 30 overlies the wafer 10, with the amount of overhang of the hood 18 being represented by the letter "A", and the width of the ring-shaped surface of the clamping ring 16 actually contacting and clamping the wafer 10 being indicated by the letter "B". As shown in FIG. 5, with the clamping ring 16 removed, there remains on the surface of the wafer 10, a ring-shaped layer of the photoresist 30. Because this layer 30 of photoresist comes into repeated contact with the clamping surface 26, a residual amount of the photoresist tends to stick to the surface of the clamping ring 16 and accumulates there until it begins to interfere with the release of the wafer 10 from the clamping ring 16.

It has been discovered that the adherence and build-up of deposited materials on the surfaces of the clamping ring 16 can be controlled by creating a desired surface finished on the affected clamping surfaces. Specifically, it has been found that surface roughnesses above a minimum value significantly reduce the tendency of the deposited materials to adhere to the clamping ring 16. The exact surface roughness will depend upon the material used as the clamping ring 16 and the materials being deposited, however, generally the surface roughness should be at least 100 $\mu$m and can be up to 1000 $\mu$m. The desired surface roughness can be achieved by any of several techniques, including surface grinding, or other machining techniques, or etching. In the case of semi-conductor processing where it is desired to avoid adherence of photoresist to the clamping ring 16, a surface roughness of at least 100 $\mu$m has been found to be effective.

From the foregoing description, it is apparent that the present invention not only provides for the accomplishment of the objects of the invention, but does so in a particularly simple and economical manner. It is recognized, of course, that those skilled in the art may make various modifications or additions to the preferred embodiments chosen to illustrate the invention without departing from the spirit and scope of the present contribution to the art. Accordingly, it is to be understood that the protection sought and to be forwarded hereby should be deemed to extend to the subject matter claimed and all equivalents thereof within the scope of the invention.

We claim:

1. For use in processing semi-conductor wafers, a method of preventing a wafer clamp from adhering to materials deposited onto the surface of the wafer, comprising the step of:

creating a surface roughness on those portions of the clamp intended to contact the wafer surface which tends to prevent the deposited materials from adhering to the clamp portions.

2. The method of claim 1, wherein the surface roughness is created by etching.

3. The method of claim 1, wherein the surface roughness is created by grinding.

4. The method of claim 1, wherein the surface roughness is created by treating the surfaces of the clamp portions such that the surfaces have a surface roughness of at least 100 μm.

5. The method of claim 1, wherein the surface roughness is created by treating the surfaces of the clamp portions such that the surfaces have a surface roughness between 100 μm and 1000 μm.

6. A method of preventing build-up of a film on a clamp employed to hold a semi-conductor wafer within a semi-conductor processing chamber wherein the film is deposited on the wafer, comprising the step of:

providing the surfaces of the clamp which are contacted by the deposited film with a surface roughness sufficient to prevent the film from adhering to the clamp surfaces.

7. The method of claim 6, where the clamp surfaces are provided with a surface roughness of at least 100 μm, and the deposited film is a photoresist.

8. A method of processing a semi-conductor wafer, comprising the steps of:

placing the wafer within a deposition chamber;

applying a clamp to the wafer to hold the wafer in place;

depositing a photoresist onto the wafer in a manner such that at least portions of the clamp are contacted by the photoresist; and treating surfaces of the clamp portions such that the surfaces of the clamp portions possess a surface roughness sufficiently high to prevent the photoresist from adhering to the clamp surface.

9. The method of claim 8, including the step of implanting ions in the semi-conductor wafer.

10. The method of claim 8 wherein the surface roughness is at least 100 μm.

11. A clamp for holding a semi-conductor wafer within a semi-conductor chamber in which films are deposited onto the wafer, comprising:

a ring-shaped member having a clamping surface for engaging and holding the wafer, the clamping surface having a surface roughness sufficiently great to prevent the deposited film from adhering to the clamping surface.

12. The clamp of claim 11 wherein:

the ring-shaped member is formed of a metal, and the clamping surface has a surface roughness of at least 100 μm.

* * * * *